(12) United States Patent
Yee et al.

(10) Patent No.: US 10,269,851 B2
(45) Date of Patent: Apr. 23, 2019

(54) METHODS AND APPARATUS FOR SENSOR MODULE

(71) Applicant: Taiwan Semiconductor Manufacturing Company, Ltd., Hsin-Chu (TW)

(72) Inventors: Kuo-Chung Yee, Hsin-Chu (TW); Chun Hui Yu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/853,007

(22) Filed: Sep. 14, 2015

(65) Prior Publication Data

US 2016/0013235 A1    Jan. 14, 2016

Related U.S. Application Data

(62) Division of application No. 13/606,289, filed on Sep. 7, 2012, now Pat. No. 9,136,293.

(51) Int. Cl.
*H01L 27/146* (2006.01)
*H01L 23/48* (2006.01)

(52) U.S. Cl.
CPC .... *H01L 27/14632* (2013.01); *H01L 27/1464* (2013.01); *H01L 27/14618* (2013.01);
(Continued)

(58) Field of Classification Search
CPC ..... H01L 24/03; H01L 23/481; H01L 25/043; H01L 27/14618; H01L 27/14632; H01L 27/1464; H01L 27/14634
See application file for complete search history.

(56) References Cited

U.S. PATENT DOCUMENTS

2008/0116589 A1* 5/2008 Li .................. H01L 21/563
257/780
2009/0186446 A1   7/2009 Kwon et al.
(Continued)

FOREIGN PATENT DOCUMENTS

JP      2011035362      2/2011
KR   1020020032013      5/2002
(Continued)

OTHER PUBLICATIONS

Eloy, J.C., "Market Trends & Cost Analysis for 3D ICs," Yale Development, 2007, retrieved from http://www.imicronews.com/upload/conference/EVG_3D_IC_Webcast_v1.pdf.

*Primary Examiner* — Matthew C Landau
*Assistant Examiner* — Mark Hatzilambrou
(74) *Attorney, Agent, or Firm* — Slater Matsil, LLP

(57) ABSTRACT

Methods and apparatus for integrating a CMOS image sensor and an image signal processor (ISP) together using an interposer to form a system in package device module are disclosed. The device module may comprise an interposer with a substrate. An interposer contact is formed within the substrate. A sensor device may be bonded to a surface of the interposer, wherein a sensor contact is bonded to a first end of the interposer contact. An ISP may be connected to the interposer, by bonding an ISP contact in the ISP to a second end of the interposer contact. An underfill layer may fill a gap between the interposer and the ISP. A printed circuit board (PCB) may further be connected to the interposer by way of a solder ball connected to another interposer contact. A thermal interface material may be in contact with the ISP and the PCB.

20 Claims, 8 Drawing Sheets

(52) U.S. Cl.
CPC .. *H01L 27/14621* (2013.01); *H01L 27/14636* (2013.01); *H01L 27/14641* (2013.01); *H01L 27/14683* (2013.01); *H01L 23/481* (2013.01); *H01L 2924/0002* (2013.01)

(56) References Cited

U.S. PATENT DOCUMENTS

| | | | |
|---|---|---|---|
| 2009/0212418 A1* | 8/2009 | Gurrum | H01L 23/293 257/717 |
| 2009/0267170 A1 | 10/2009 | Chien et al. | |
| 2010/0141815 A1* | 6/2010 | Yoshihara | H01L 27/14618 348/294 |
| 2011/0024862 A1* | 2/2011 | Tu | H01L 27/14618 257/434 |
| 2011/0024888 A1* | 2/2011 | Pagaila | H01L 23/13 257/686 |
| 2011/0074028 A1* | 3/2011 | Pendse | H01L 21/563 257/737 |
| 2011/0180819 A1* | 7/2011 | Van Elmpt | F21K 9/00 257/88 |
| 2011/0210444 A1* | 9/2011 | Jeng | H01L 23/13 257/738 |
| 2012/0013013 A1* | 1/2012 | Sadaka | H01L 23/5384 257/773 |
| 2012/0106117 A1 | 5/2012 | Sundaram et al. | |
| 2012/0248439 A1* | 10/2012 | Lee | H01L 23/49838 257/48 |

FOREIGN PATENT DOCUMENTS

| | | |
|---|---|---|
| KR | 100351925 | 9/2002 |
| KR | 1020110130214 | 12/2011 |

\* cited by examiner

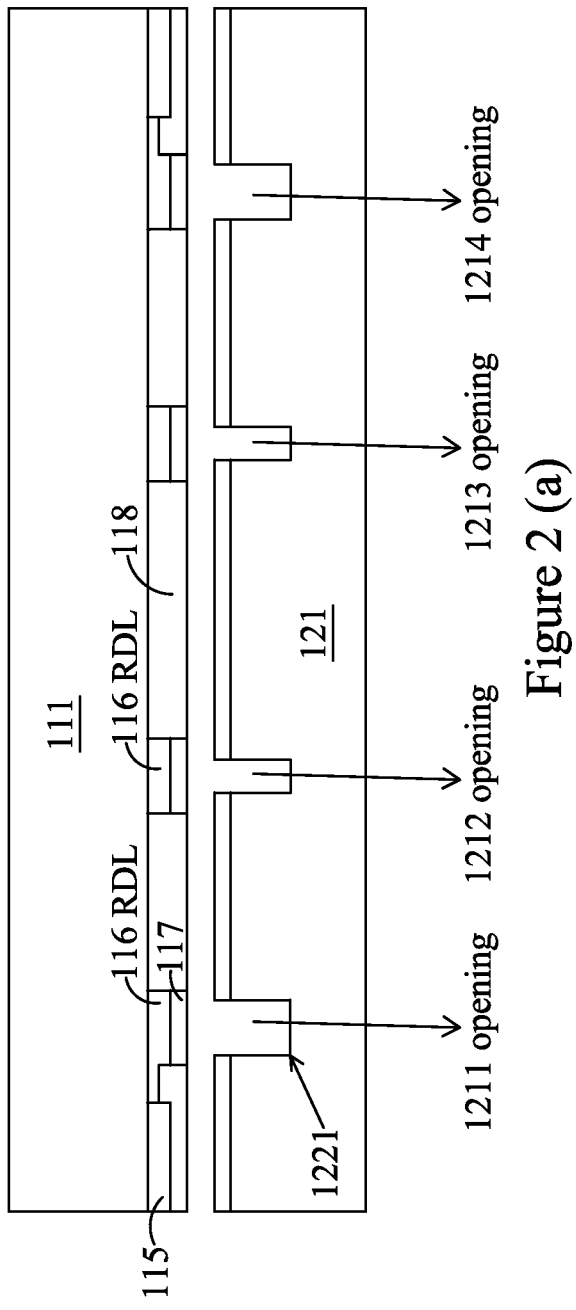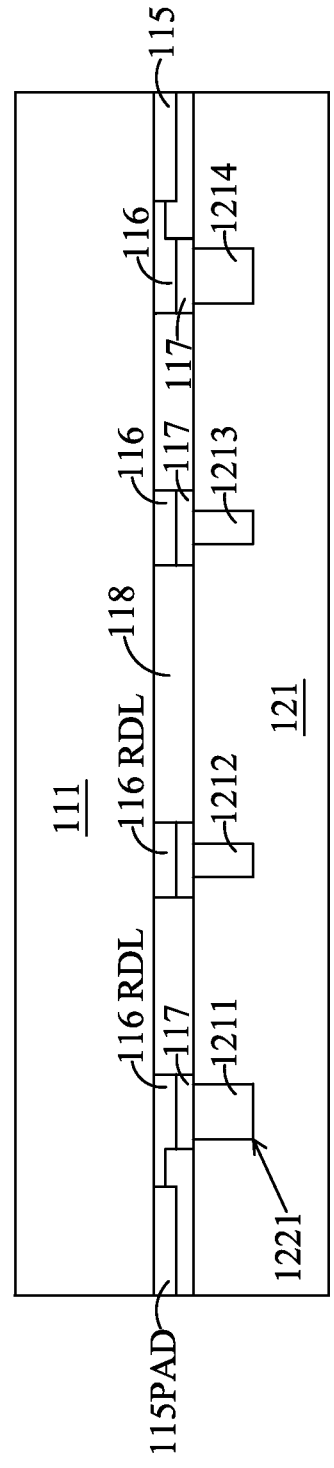
Figure 2 (a)
Figure 2 (b)

METHODS AND APPARATUS FOR SENSOR MODULE

PRIORITY CLAIM AND CROSS-REFERENCE

This application is a divisional of U.S. patent application Ser. No. 13/606,289, filed Sep. 7, 2012, entitled "Methods and Apparatus for Sensor Module," which application is hereby incorporated herein by reference in its entirety.

BACKGROUND

Complementary metal-oxide semiconductor (CMOS) image sensors are gaining in popularity over traditional charged-coupled devices (CCDs). A CMOS image sensor typically comprises an array of picture elements (pixels), which utilizes light-sensitive CMOS circuitry to convert photons into electrons. The light-sensitive CMOS circuitry typically comprises a photodiode formed in a silicon substrate. As the photodiode is exposed to light, an electrical charge is induced in the photodiode. Each pixel may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC) or an image signal processor (ISP).

A CMOS image sensor (CIS), or simply a CMOS sensor, may have a front side where a plurality of dielectric layers and interconnect layers are located connecting photodiodes in the substrate to the peripheral circuitry. A CMOS sensor is a front-side illuminated (FSI) image sensor if the light is from the front side of the sensor, otherwise it is a back-side illuminated (BSI) sensor with light incident on the backside. For a BSI sensor, light can hit the photodiode through a direct path without obstructions from the dielectric layers and interconnect layers located at the front side. This helps to increase the number of photons converted into electrons, and makes the CMOS image sensor more sensitive to the light source.

The image sensor market is being driven toward low cost, high image quality, and small camera module size. In digital still camera (DSC) approach, an ISP and a CIS are produced as two separated packages which occupy a larger board space and consume higher system power. Meanwhile, the system on chip (SOC) CMOS image sensor compact camera module (CCM) approach used in mobile handsets is facing the challenge of inadequate image data transmission rate, since the current image sensor applications require a stand-alone and powerful ISP. Although existing image sensor devices and methods of fabricating image sensor devices have been generally adequate for their intended purposes, as device scaling down continues, they have not been entirely satisfactory in all respects.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the disclosure, and do not limit the scope of the disclosure.

Methods and apparatus for integrating a CMOS image sensor (CIS) and an image signal processor (ISP) together using an interposer to form a system in package (SiP) device module are disclosed. The SiP device module can be mounted to a printed circuit board (PCB) to form a complete system. The front side of a BSI sensor device can be bonded to a surface of an interposer using oxide-oxide bonding or other bonding methods. The front side of an ISP chip can be further directly bonded on another surface of the interposer, without using a redistribution layer (RDL). An optional metal coating on the ISP backside surface can conduct heat to a PCB. Therefore a low thermal conductivity interposer may function as a heat insulation between an ISP and a BSI sensor. Direct bonding between the BSI sensor and the interposer, and the interposer and the ISP reduces system board space and also reduces system power consumption with enhanced image processing performance and data transmission rate.

Figure 1A:
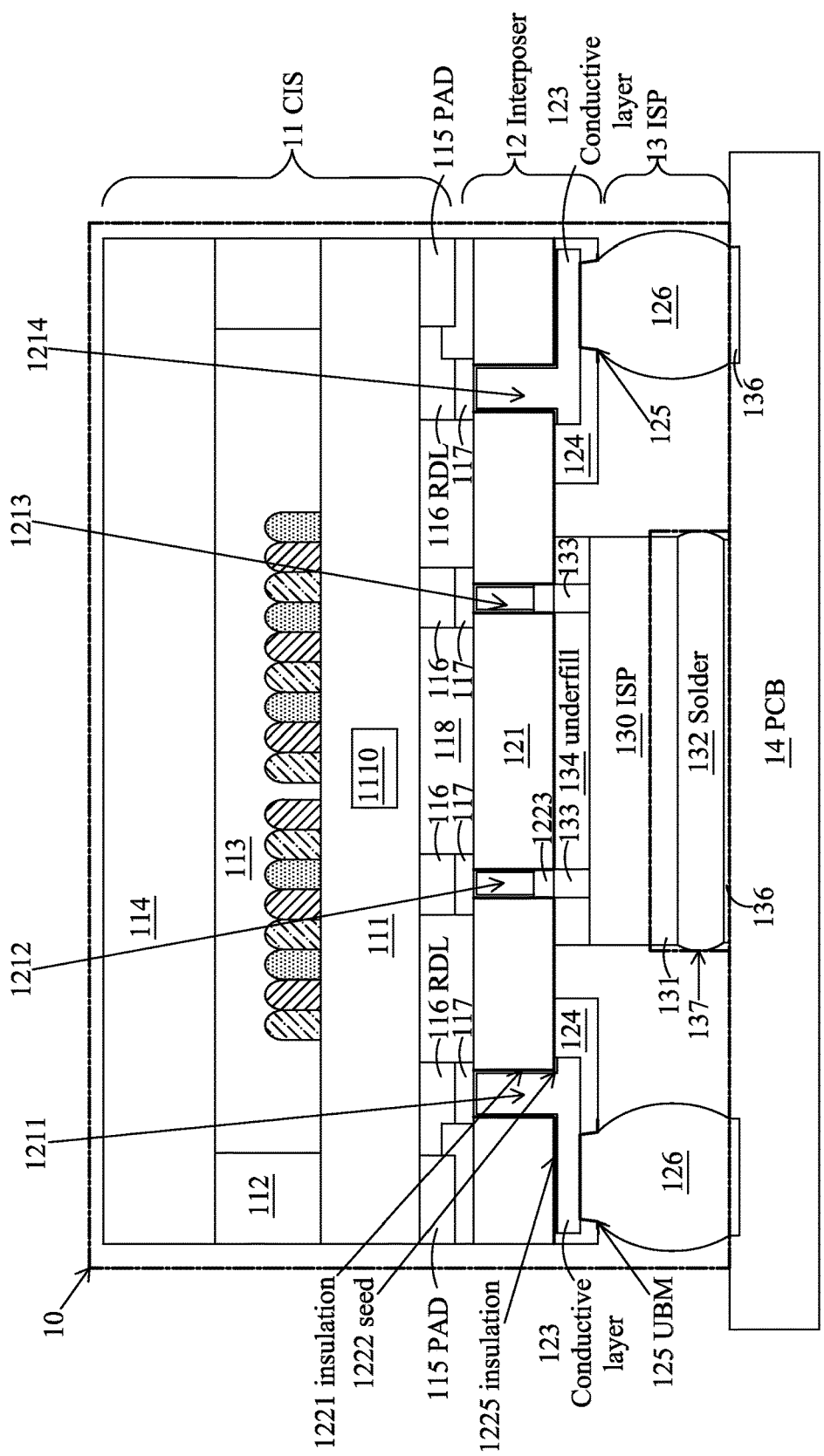
FIGS. 1(a)-1(b) are a cross-sectional view of a system in package module integrating a CMOS image sensor and an image signal processor (ISP)

FIG. 1(a) illustrates an exemplary system in package (SiP) device 10 where multiple integrated circuits are connected to an interposer vertically, forming a device structure 10 that is mounted to a printed circuit board ("PCB") 14. A CIS module 11 comprising a BSI device 111, and an ISP module 13 comprising an ISP device 130 are connected together vertically by an interposer module 12 to form the device 10. There may be other multiple dies stacked or horizontally connected to the interposer 12, which are not shown. The CIS module 11 may contain some other forms of sensor such as a CCD sensor. The SiP device module 10 is mounted onto the PCB 14 using a plurality of bumps 126. Optional metal coating on the ISP backside surface such as the metal coating 131 can conduct heat to the PCB. More details of each module are illustrated below.

The CIS module 11 may comprise a BSI sensor device 111 made up of millions of components such as active devices and passive devices made on a substrate. The BSI device 111 may be made on a substrate, which may be a semiconductor material such as silicon, germanium, diamond, or the like. The substrate may be doped with a p-type dopant, such as boron, aluminum, gallium, or the like, although the substrate may alternatively be doped with an n-type dopant, as is known in the art. The BSI device 111 may comprise a grid or array of pixels or sensor elements made on the substrate. A pixel or a sensor element may comprise a photosensitive diode, or simply referred as a photodiode, such as the one shown as 1110, connected to a transistor or to a plurality of transistors, which may be a transfer transistor, a reset transistor, a source follower transistor, or a select transistor. The photodiode 1110 may generate a signal related to the intensity or brightness of light that impinges on the photosensitive diode. The photosensitive diode may be a pinned layer photodiode comprising a p-n-p junction. A non-pinned layer photodiode may alternatively be used. Any suitable photodiode may be utilized with the embodiments, and all of these photodiodes are intended to be included within the scope of the embodiments. The substrate may further comprise a plurality of isolation areas to separate and isolate various devices formed on the substrate, and also to separate the pixels from other logic regions of the sensor.

On the backside of the BSI device 111, a dielectric layer may be formed. A micro-lens layer and a color filter layer 113 may be formed on the dielectric layer for color imaging applications. Associated with each color filter element is a corresponding micro-lens. The color filter elements and associated micro-lenses may be aligned with the photodiodes of the sensor. The micro-lens lenses may be located above the color filter, such that the backside-illuminated light can be focused on the light-sensing regions. The micro-lens converges light illuminated from the backside of the substrate to the photodiode.

Dams 112 are formed surrounding the perimeter of the BSI device 111. A frame glue may be coated over the surface of the dam. A transparent cover 114 such as an optical cover glass may cover over the top of the frame glue to form a sealed space between the transparent cover 114 and the BSI device 111, which makes the BSI device packaging structure not easy to blow out and more reliable.

On the front side of the BSI device 111, a plurality of conductive and dielectric layers may be formed, which are collectively referred to as the inter-metal dielectric (IMD) layer 118, to connect various devices to each other. An inter-layer dielectric layer (ILD) may be formed on the front side of the substrate below the IMD layer. The ILD and IMD layers may comprise a material such as boron phosphorous silicate glass (BPSG), although any suitable dielectrics may be used for either layer. The ILD and IMD layers may be formed of low-k dielectric materials with k values less than, for example, about 2.5.

A plurality of contacts or contact pads 115 may be formed within the IMD layer, and on the top metal layer, which may be called bond pads, connected to photodiodes and the transistors, or other function devices within the sensor. These contacts 115 may be made through any suitable formation process (e.g., lithography with etching, damascene, dual damascene, or the like) and may be formed using suitable conductive materials such as aluminum alloys, copper alloys, or the like.

A redistribution layer (a RDL layer) 116 may be formed to connect the bond pads 115 to other contacts. The RDL layer 116 may be made with, e.g., Al, Cu, or a Cu alloy. The RDL layer 116 can be made by an electrolytic plating, sputter, PVD or electroless plating process. The RDL layer 116 can be made with a single layer, or multiple layers using an adhesion layer of Ti, TiW, TaN, Ta or Cr, for example. The BSI device 111 may be connected to a number of RDL layer to form a network of inter-level interconnects which may electrically connect to the contact pads 115 according to the function of the semiconductor device.

A conductive layer 117 may be formed as a contact or contact pads 117 to connect to the RDL 116. Contact pads 117 may be made with aluminum (Al), copper (Cu), tin (Sn), nickel (Ni), gold (Au), lead (Pb), silver (Ag), bismuthinite (Bi), alloys thereof, or other electrically conductive material. The deposition of contact pad 117 may use an electrolytic plating, sputtering, PVD, or electroless plating process. The size, shape, and location of the contact pad 117 are only for illustration purposes and are not limiting. The plurality of contact pads may be of the same size or of different sizes.

The bond pads 115 or the contact pads 117 may be called sensor contacts which can be used to bond to other components such as an interposer. As illustrated in FIG. 1(a), the contact pads 117 are connected to the bond pads 115 by way of RDL 116. However, in some embodiment, a bond pad 115 may be directly bonded to the interposer without using the RDL 116. Therefore both the bond pads 115 and the contact pads 117 may be called sensor pads or sensor contacts.

The front side of the CIS module 11 is bonded to a surface of an interposer 12. The interposer 12 may provide signal remapping and additional physical support. The interposer 12 may also provide some additional thermal stress relief. Interposer 12 may comprise multiple layers of conductors and insulators forming an interconnecting substrate 121. The interposer may be made with dimensionally stable material, such as silicon, glass and the like. It may also comprise materials such as Cu, polyimide, fiberglass resin (FR4) and the like, that are semi-rigid and may flex during process temperatures. The BSI device 111 may be mounted on a surface of the interposer formed of a laminate material, silicon, ceramic, films and the like.

A plurality of openings may be formed in the substrate 121 of the interposer 12 to host interposer contacts. An opening and an interposer contact formed within are both referred by the same numeral symbol. For example, the interposer contact 1211 is formed within the opening 1211. In FIG. 1(a), there are four openings shown in the substrate 121, namely the openings 1211, 1212, 1213, and 1214. The number of openings and the locations of the openings are only for illustrative purposes and are not limiting. There may be other number of openings and located in different places of the substrate. Openings 1211 and 1214 are formed to host interposer contacts to the PCB for system wide signals, while the openings 1212 and 1213 are formed to host interposer contacts for signals connected to the ISP module 13.

For an interposer contact formed within an opening, such as the interposer contact 1211, it may comprise an insulation layer 1221, a seed layer 1222, and then may be filled by a conductive layer 123. The insulation layer 1221 may be made by SiNx deposition, oxide deposition such as SiOx deposition, or a combination. A similar insulation layer 1225 may be formed on the surface of the interposer 12, covering areas not covered by the insulation layer 1221. The insulation layer 1225 may be made by materials selected from SiNx, SiOx, PBO, BCB, or combination. The insulation layer 1225 may be at a thickness in a range from about 1 μm to about 10 μm. A seed layer 1222, which is a thin layer of the conductive material may be applied to the surface then. The conductive layer 123 is formed for an interposer contact. The conductor layer 123 may comprise materials known as conductors used with semiconductor materials such as aluminum, copper, gold, and the like and may be formed of alloys or of multiple layers.

The interposer contacts 1211 and 1214 are connected to the contact pads 117 of the CIS module at one end, and connected to the PCB at another end. The interposer contacts 1212 and 1213 are connected to the contact pads 117 of the CIS module at one end, and connected to the ISP contacts 133 at another end. The connection between the interposer contacts 1211 to 1214 and the contact pads 117 of the CIS module 11 may be by direct bonding, which may use adhesive bonding, direct copper bonding and direct oxide bonding, or any other method. In the commonly used direct copper bonding, the interposer contacts 1211 to 1214 of the interposer 12 and the contact pads 117 of the CIS module 11 are bonded by applying a high pressure, so that the interposer contacts and the sensor contacts which may be copper pads, are bonded together. The connection between the interposer contacts 1212 and 1213 to the ISP may be by way of solder 1223 formed in a solder reflow process, where the solder 1223 bonds the interposer contact 1212 to an ISP contact 133 of the ISP module 13.

The ISP module 13 is bonded to another surface of the interposer module 12. The ISP module 13 may comprise an ISP 130, which may transmit an image signal captured by the sensor to a display device such as a digital TV. The ISP 130 may also remove noise from the image signal input thereto, deinterlace the image signal when the image signal is an interlaced image signal, or scale the image signal. Together with the CSI module 11, an ISP 130 defines the image quality and the speed performance of the camera subsystem in a mobile handset. The ISP 130 may comprise a plurality of multiprocessors coupled together with a memory system and a communication system.

The ISP contact 133 may be connected to the interposer contact 1212 by a Cu—Cu bond, using a solder 1223 formed in a solder reflow process. The connection of the ISP contact 133 and the solder 1223 may be called a micro bump, while the interposer contact 1212 may be a contact or a via pad, therefore the connection between the ISP 130 and the interposer substrate 121 may be formed by a micro bump connecting to a via pad. The micro bump formed by the ISP contact 133 and the solder 1223 may be of a size about 20 micro meters in diameter, which is much smaller than the diameter about 90 micro meters of a normal bump used in bump bond.

An underfill layer 134 may fill the gap between the ISP 130 and the interposer substrate 121. The underfill 134 may be a compliant material that provides stress relief and protection for the solder connectors 1223. Underfill materials provide some stress relief and may include thermally conductive filler materials, to assist in handling mechanical stress from thermal expansion. Resins, epoxies, polymers, and the like may be used.

A thermal interface material (TIM) structure 137 may be placed between the ISP 130 and the PCB 14. An exemplary structure 137 may be formed by a metal layer 131, a solder layer 132, and a metal layer 136, placed next to each other. The combination of metal and solder is for structure support of the ISP 130 and for thermal interface. The ISP may be electronically connected to the PCB by other electronic connections such as RDL connections, which are not shown in FIG. 1(*a*).

Figure 1:
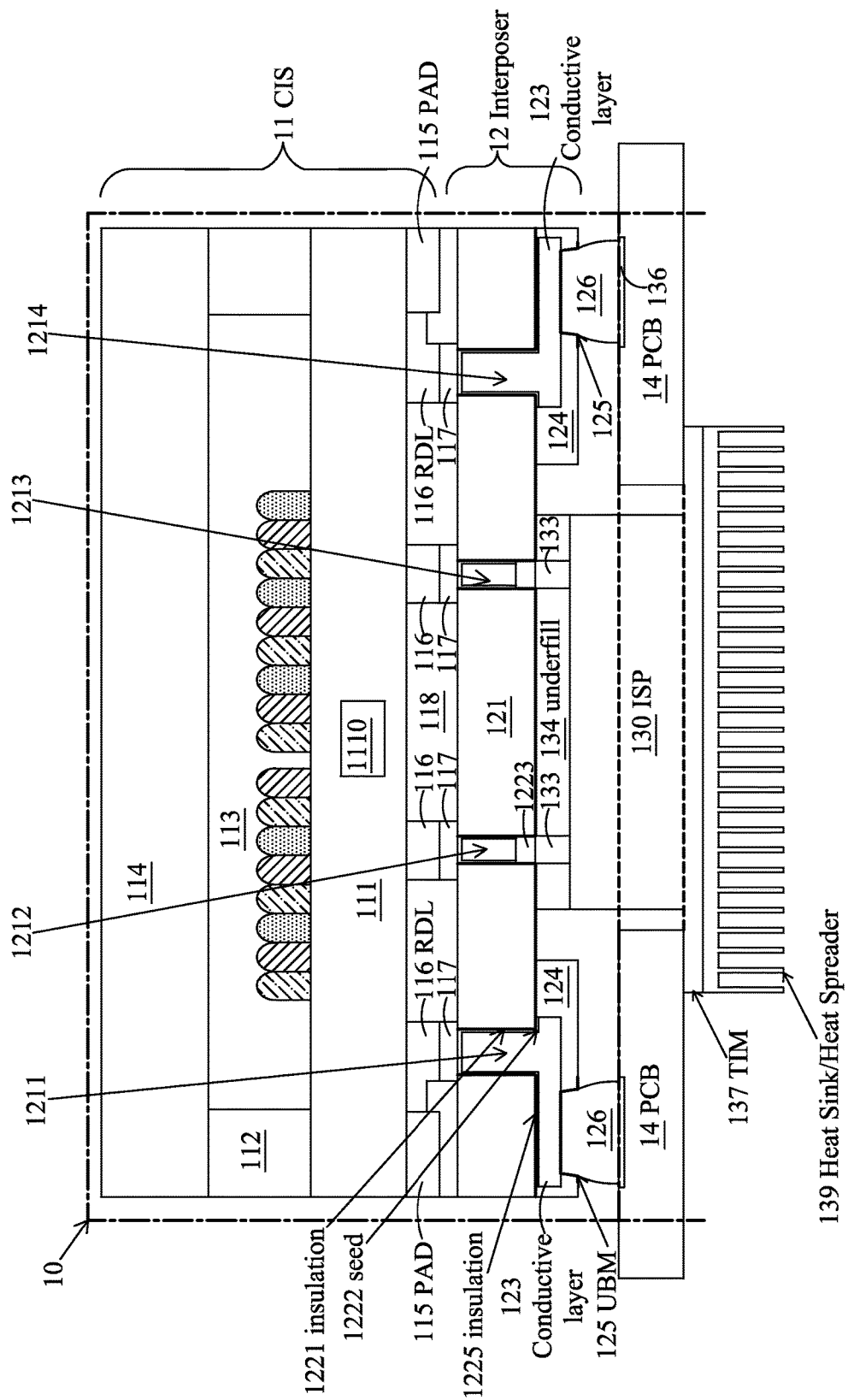

There may be other forms of TIM 137 used instead of the combination of metal 131, solder 132, and the metal 136 as shown in FIG. 1(*a*). The TIM 137 may be positioned in different locations related to the PCB 14. As illustrated in FIG. 1(*b*), the PCB 14 may be a PCB with a through cavity. The ISP 130 may be located in the through cavity of the PCB 14. The TIM 137 may be connected to the ISP 130. A heat spreader 139 may be connected to TIM 137 to spread heat away.

The interposer module 12 may be connected to the PCB 14 by connecting a bump to the interposer contact 1211. As shown in FIG. 1(*a*), a passivation layer 124 may be formed over the surface of the substrate 121 and on top of the conductive layer 123 for structural support and physical isolation. Passivation layer 124 can be made with silicon nitride (SiNx), silicon dioxide (SiO2), silicon oxynitride (SiON), polyimide (PI), benzocyclobutene (BCB), polybenzoxazole (PBO), or other insulating material. An opening of the passivation layer may be made by removing a portion of the passivation layer 124 using a mask-defined photoresist etching process to expose the conductive layer 123 of the interposer contact 1211. A redistribution layer (a RDL layer), not shown, may be formed to connect the conductive layer 123 to other contacts. The RDL layer may be made with, e.g., Al, Cu, or a Cu alloy. An under-bump metal (UBM) pad 125 may be formed connected to the RDL layer or on top of the conductive layer 123 directly. An under-bump metal (UBM) pad is disposed between the solder bump or solder ball 126 and the conductive layer 123. The UBM pad has contact perimeter formed with the solder ball 126, and extends beyond the contact perimeter a sufficient distance to block alpha particles emitted from the surface of the solder ball from causing an upset event in the semiconductor portion. Attached to UBM pad 125 are solder balls or solder balls 126, for mounting the SiP module 10 to a system board PCB 14.

Figure 2:
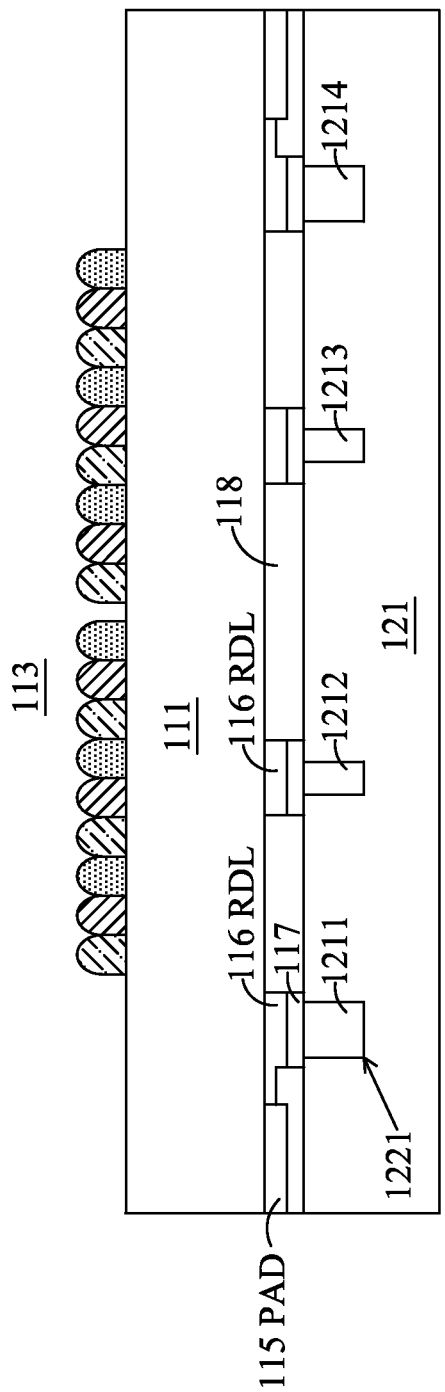
FIGS. 2(a)-2(i) illustrate an exemplary process of integrating a CMOS image sensor and an ISP together using an interposer.
Figure 2:
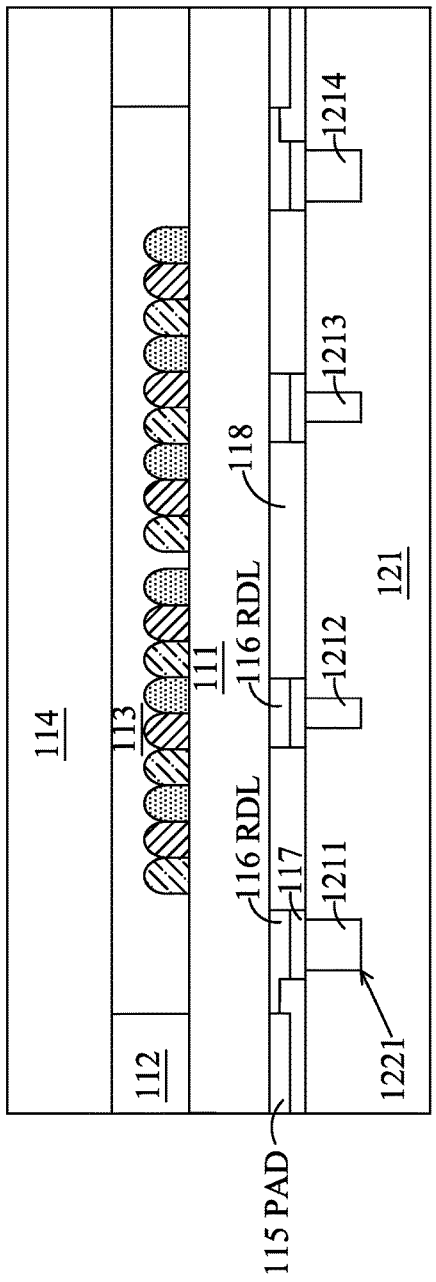
Figure 2:
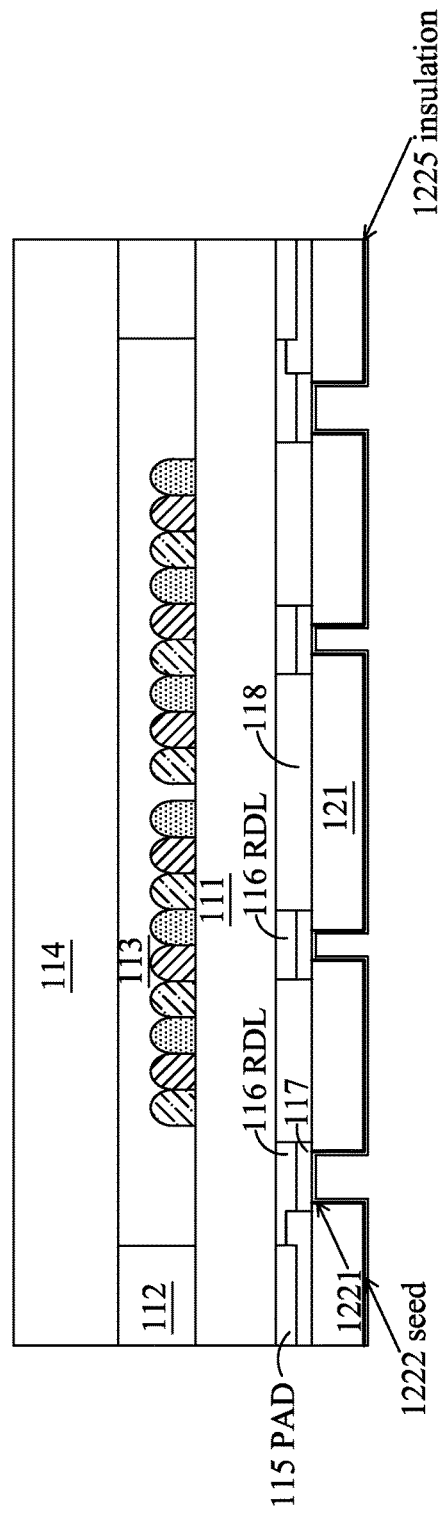
Figure 2:
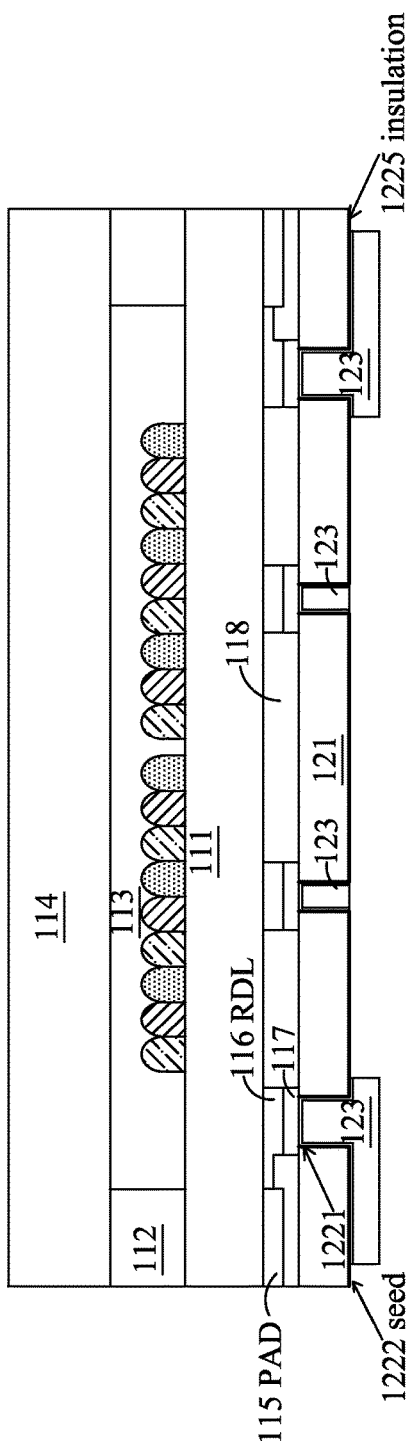
Figure 2:
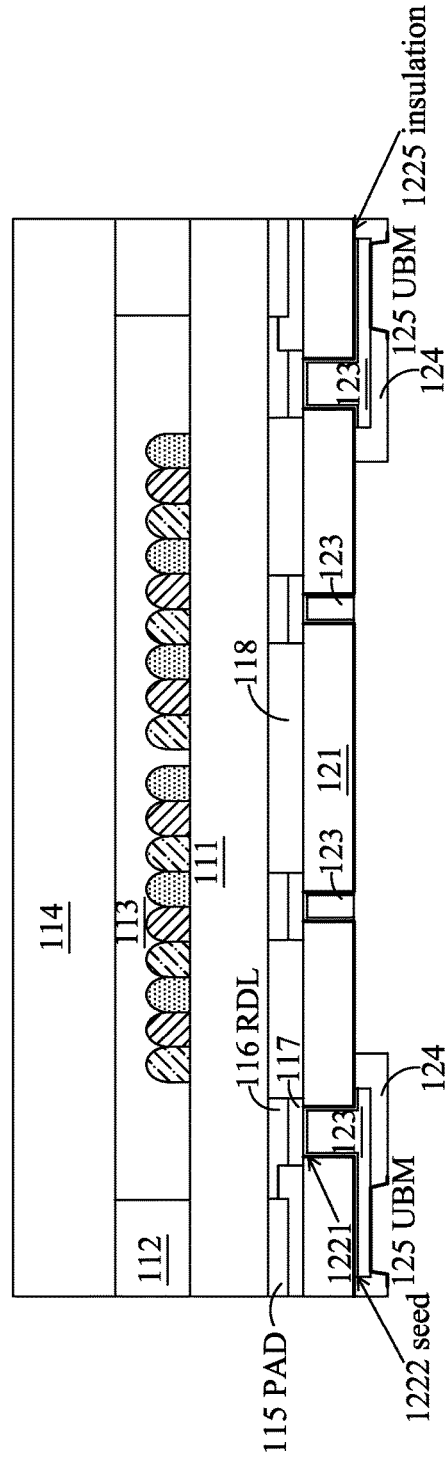
Figure 2:
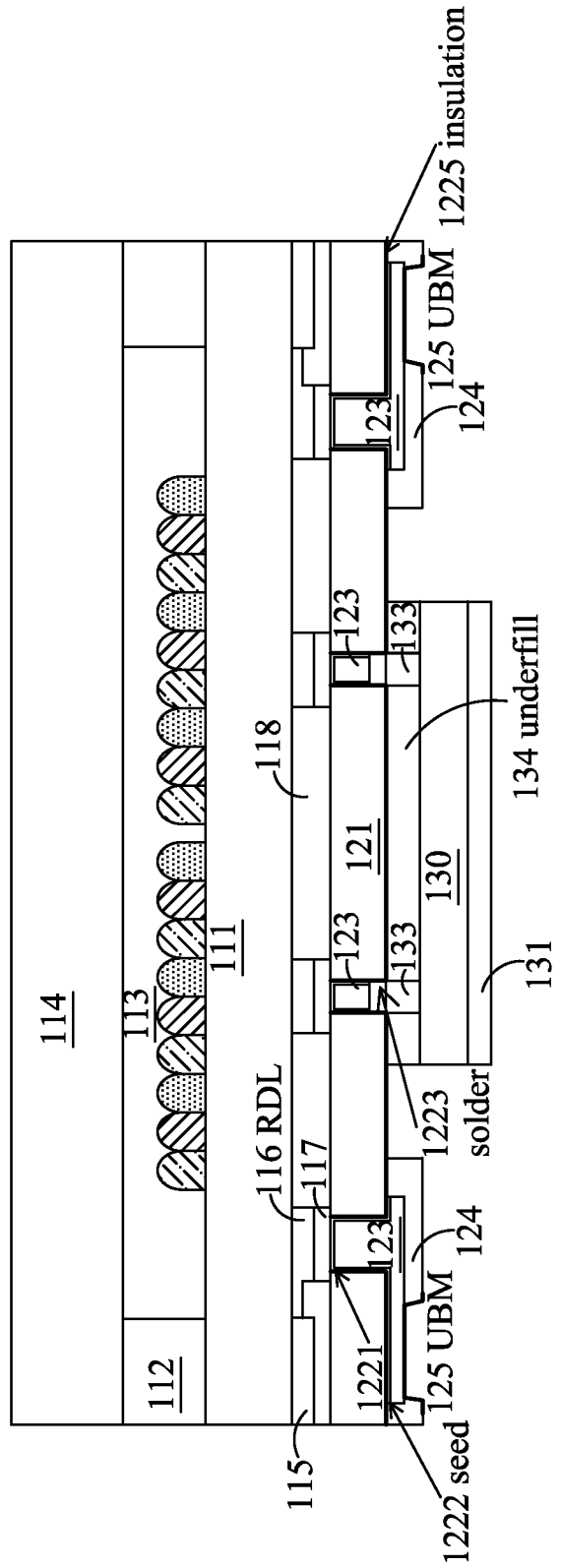
Figure 2:
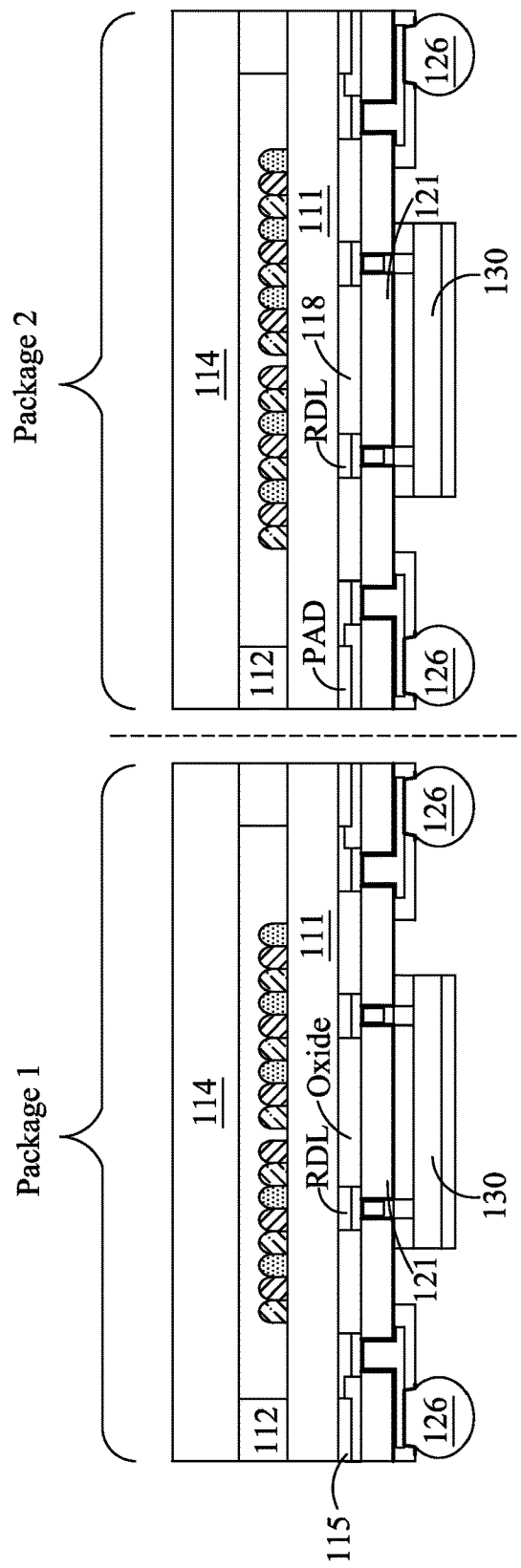

FIGS. 2(*a*)-2(*h*) illustrate an exemplary process of integrating a CMOS image sensor and an image signal processor (ISP) together using an interposer.

FIG. 2(*a*) illustrates a BSI sensor device 111 which may be a sensor device substrate containing millions of components, such as an array of pixels or sensor elements comprising photodiodes and transistors, and a plurality of isolation areas to separate and isolate various devices formed on the substrate. On the front side of the BSI device 111, a plurality of conductive and dielectric layers may be formed, which are collectively referred to as the inter-metal dielectric (IMD) layer 118, to connect various devices to each other. A plurality of contacts or contact pads 115 may be formed within the IMD layer, connected to photodiodes and the transistors, or other function devices within the sensor. A redistribution layer (a RDL layer) 116 may be formed to connect the bond pads 115 to other contacts. A conductive layer 117 may be formed as a contact 117 to connect to the RDL contact 116. Both the contact pads 115 and the contacts 117 may be referred as sensor contacts.

An interposer is also provided in FIG. 2(*a*). The interposer may comprise multiple layers of conductors and insulators forming an interconnecting interposer substrate 121. There are four openings shown in the interposer substrate 121, namely the openings 1211, 1212, 1313, and 1214. The number of openings and the locations of the openings are only for illustrative purposes and are not limiting. Openings 1211 and 1214 are formed to host interposer contacts to the PCB for system wide signals, while the openings 1212 and 1213 are formed to host interposer contacts connected to the ISP module 13. An insulation layer 1221 is formed over the surface of the interposer substrate 121 and interior surface of each opening 1211-1214. The insulation layer 1221 may be made by SiNx deposition, oxide deposition such as SiOx deposition, or a combination.

Illustrated in FIG. 2(*b*), the BSI sensor device 111 and the interposer substrate 121 may be bonded together using adhesive bonding, direct copper bonding and direct oxide bonding, or any other bonding method. A sensor contact 117 may be directly bonded at the top of an opening, which will be filled by an interposer contact later to form a connection between an interposer contact and a sensor contact. The BSI sensor device 111 may be thinning down by grinding before other components, such as micro-lens and color filters are attached. The BSI sensor device 111 may be thinning down to a height about 2 μm.

FIG. 2(*c*) illustrates a process of forming a micro-lens layer and a color filter layer 113 on the backside of the sensor device 111 for color imaging applications. Associated with each of the color filter elements is a corresponding micro-lens. The color filter elements and associated micro-lenses may be aligned with the photosensitive elements of the sensor layer using alignment marks. The micro-lens converges light illuminated from the backside of the substrate to the photodiode.

FIG. 2(d) illustrates a process of forming a plurality of dams 112 surrounding the perimeter of the BSI device 111 on the backside of the BSI device 111. A frame glue may be coated over the surface of the dam. A transparent cover 114 such as an optical cover glass may cover over the top of the frame glue to form a sealed space between the transparent cover 114 and the BSI device 111, which makes the BSI device packaging structure not easy to blow out and more reliable.

FIG. 2(e) illustrates that the interposer substrate 121 may be thinned at the side not bonded to the BSI sensor, so that the openings 1211 to 1214 are completely open. For an embodiment, an insulation layer 1225 may be formed on the thinned down surface of the interposer. Furthermore, a seed layer 1222, which is a thin layer of the conductive material, may be applied to the surface of each opening and insulation layer.

As illustrated in FIG. 2(f), a conductor layer 123 may be formed on top of the seed layer within each opening. The conductor layer 123 may comprise materials known as conductors used with semiconductor materials such as aluminum, copper, gold, and the like and may be formed of alloys or of multiple layers. The structure formed within each opening comprising an insulation layer, a seed layer, and a conductor layer is referred to as an interposer contact. There may be other ways to form an interposer contact, with similar or different materials.

FIG. 2(g) illustrates forming a passivation layer, an optional RDL layer, and an under-bump metal (UBM) pad to connect the interposer substrate to the PCB. For the openings 1211 and 1214 used to contact to PCB, a passivation layer 124 may be formed over the surface of the substrate 121 and on top of the conductor layer 123 for structural support and physical isolation. An opening of the passivation layer is made by removing a portion of the passivation layer 124 using a mask-defined photoresist etching process to expose the contact pad 123. A redistribution layer (a RDL layer) may be formed to connect the contact pad 123 to other contacts. An under-bump metal (UBM) pad 125 may be formed connected to the RDL layer or on top of the conductor layer 123 directly. The UBM pad is disposed between a solder ball and the conductor layer 123.

FIG. 2(h) illustrates making connections between the interposer substrate and an ISP 130. As shown in FIG. 2(f), a conduct layer 123 is formed within the openings 1212 and 1213. An ISP 130 may be connected to the conductor layer 123 by the ISP contacts 133. The ISP contact 133 may be connected to the interposer contact 1212 in a Cu—Cu bond, by way of a solder 1223 formed in a solder reflow process. The connection of the ISP contact 133 and the solder 1223 may be called a micro bump, while the interposer contact 1212 may be a contact or a via pad, therefore the connection between the ISP 130 and the interposer substrate 121 may be formed by a micro bump connecting to a via pad.

An underfill layer 134 may be used to fill the gap between the ISP 130 and the interposer substrate 121. The underfill 134 may be a compliant material that provides stress relief and protection for the solder connectors 1223.

FIG. 2(i) further illustrates that the process shown in FIG. 2(a)-2(h) may be done in a wafer level where a wafer comprises a plurality of sensor dies. After the integration of BSI dies with an ISP module is done on each die, the wafer can be sawed and each die package can be separated.

Although the illustrative embodiment and its advantages have been described in detail, it should be understood that various changes, substitutions, and alterations can be made herein without departing from the spirit and scope of the disclosure as defined by the appended claims. For example, many of the features and functions discussed above can be implemented in software, hardware, or firmware, or a combination thereof. As another example, it will be readily understood by those skilled in the art that dimensions may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device, comprising:
an image sensor device having a first surface and a second surface opposite the first surface;
an interposer having a first surface and a second surface opposite the first surface, the first surface of the interposer bonded to the first surface of the image sensor device, the image sensor device and the interposer having a same width, wherein the interposer comprises:
one or more conductive vias extending through the interposer;
a redistribution layer (RDL) proximate the second surface of the interposer, a conductive feature of the RDL being electrically connected to a first via of the one or more conductive vias; and
a passivation layer over the RDL, the RDL being between the passivation layer and the one or more conductive vias, the passivation layer covering sidewalls of the conductive feature and covering a first portion of a first surface of the conductive feature while exposing a second portion of the first surface of the conductive feature;
an image signal processor (ISP) bonded to the second surface of the interposer, the one or more conductive vias electrically connecting the image sensor device to the ISP; and
an underfill disposed between the ISP and the second surface of the interposer, a first surface of the underfill and a first surface of the passivation layer contacting the second surface of the interposer, the first surface of the underfill and the first surface of the passivation layer being level with one another.

2. The device of claim 1, further comprising a color filter layer disposed over the second surface of the image sensor device.

3. The device of claim 1, wherein the first surface and the second surface of the image sensor device comprise a frontside and a backside of the image sensor device, respectively.

4. The device of claim 1, wherein the ISP comprises contacts extending through the underfill and contacting the one or more conductive vias.

5. The device of claim 1, wherein the interposer comprises a first dielectric layer, and wherein the first surface of the interposer comprises a surface of the first dielectric layer.

6. The device of claim 5, wherein the image sensor device comprises a second dielectric layer, and wherein the first surface of the image sensor device comprises a surface of the second dielectric layer.

7. The device of claim 1, wherein the RDL comprises a plurality of conductive features, wherein the passivation layer comprises a plurality of regions that are separated from each other, wherein each of the plurality of regions of the passivation layer surrounds a respective one of the plurality of conductive features.

8. The device of claim 1, wherein the interposer is bonded to the image sensor device through direct copper bonding and direct oxide bonding.

9. The device of claim 1, wherein the underfill is separated from the passivation layer by a gap.

10. A device, comprising:
a back-side illuminated (BSI) device having a frontside and a backside;
a redistribution layer (RDL) disposed at the frontside of the BSI device, the RDL electrically coupled to the BSI device;
an interposer disposed at a surface of the RDL facing away from the BSI device, the interposer having a plurality of conductive vias formed therein, the plurality of conductive vias electrically coupled to the RDL, the interposer having a contact pad and a passivation layer that are disposed at a first side of the interposer facing away from the BSI device, wherein the contact pad is electrically connected to a first via of the plurality of conductive vias, and the passivation layer partially covers a surface of the contact pad distal the RDL;
an image signal processor (ISP) device bonded to the first side of the interposer with an underfill therebetween, the ISP device electrically coupled to a second via of the plurality of conductive vias, wherein the passivation layer is not interposed between the ISP device and the interposer, wherein a surface of the underfill and a surface of the passivation layer each contact the first side of the interposer, the surface of the underfill being level with the surface of the passivation layer; and
a printed circuit board (PCB) bonded to the ISP device through a thermal interface material (TIM) structure, wherein the ISP device is between the PCB and the interposer, wherein the TIM structure comprises:
a first metal layer on a surface of the ISP device facing the PCB;
a second metal layer on a surface of the PCB facing the ISP device; and
a solder layer between the first metal layer and the second metal layer.

11. The device of claim 10, further comprising a bump laterally separated from the ISP device and electrically coupled to the PCB and the interposer.

12. The device of claim 11, wherein the bump is electrically coupled to the first via through the contact pad and through an under bump metal (UBM) pad connected to the contact pad, wherein a contact of the ISP device is electrically coupled to the second via through a solder region, the solder region extending continuously from the contact of the ISP device to the second via.

13. The device of claim 10, wherein the interposer and the BSI device have a same width.

14. The device of claim 10, wherein the passivation layer covers sidewalls of the contact pad.

15. A device, comprising:
an interposer having a first surface and a second surface, wherein a first dielectric layer is disposed over the first surface of the interposer, wherein a redistribution layer (RDL) and a passivation layer are disposed proximate the second surface of the interposer opposing the first surface, with the RDL between the passivation layer and the first dielectric layer, wherein a plurality of conductive vias extend from the second surface to the first surface and through the first dielectric layer, and wherein the passivation layer covers a first portion of a top surface of the RDL distal the first surface of the interposer, and exposes a second portion of the top surface of the RDL;
a sensor device having a first surface and a second surface, wherein a color filter layer is disposed over the second surface of the sensor device, a second dielectric layer is disposed over the first surface of the sensor device, and bonded to the first dielectric layer;
an image signal processor (ISP) bonded to the second surface of the interposer, wherein the ISP and the sensor device are electrically connected through the plurality of conductive vias; and
an underfill layer disposed between the interposer and the ISP, the underfill layer and the passivation layer being in contact with the interposer, wherein a surface of the passivation layer in contact with the interposer is level with a surface of the underfill layer in contact with the interposer, and wherein the passivation layer is separated from the underfill layer by a distance.

16. The device of claim 15, wherein the first dielectric layer and the second dielectric layer comprise a same material.

17. The device of claim 15, wherein the sensor device further comprises a dam at the second surface surrounding a perimeter of the sensor device.

18. The device of claim 17, wherein the sensor device further comprises an optical cover glass over a top of the dam to form a sealed space between the optical cover glass and a substrate of the sensor device.

19. The device of claim 15, further comprising a printed circuit board (PCB), wherein the PCB is connected to the second surface of the interposer.

20. The device of claim 15, wherein the underfill layer is laterally separated from the passivation layer.

* * * * *